United States Patent [19]
Kaifu et al.

[11] Patent Number: 4,935,637
[45] Date of Patent: Jun. 19, 1990

[54] LINEAR ELEMENT ARRAY WITH WIRE BONDING ARRANGEMENT

[75] Inventors: Noriyuki Kaifu; Hiroo Ichihashi, both of Hiratsuka; Katsumi Komiyama, Isehara; Masayoshi Murata; Satoshi Itabashi, both of Atsugi; Katsunori Terada, Sagamihara; Hiromi Kodama, Atsugi; Hideyuki Suzuki, Machida; Kenji Morimoto, Ebina; Tetsuya Shimada, Hiratsuka, all of Japan

[73] Assignee: Canon Kabushiki Kaisha, Tokyo, Japan

[21] Appl. No.: 393,024

[22] Filed: Aug. 10, 1989

Related U.S. Application Data

[63] Continuation of Ser. No. 210,182, Jun. 22, 1988, abandoned, which is a continuation of Ser. No. 24,979, Mar. 12, 1987, abandoned.

[30] Foreign Application Priority Data

Mar. 14, 1986 [JP] Japan .................................. 61-56624

[51] Int. Cl.$^5$ ............................................. H01J 40/14
[52] U.S. Cl. ..................................... 250/578.1; 357/30
[58] Field of Search .......................... 250/578, 211 J; 346/76 PH; 357/32, 65, 23.7, 30 Q, 30 R, 30 H

[56] References Cited

U.S. PATENT DOCUMENTS

| | | | |
|---|---|---|---|
| 4,288,702 | 9/1981 | Ozawa et al. | 357/32 |
| 4,594,613 | 6/1986 | Shinbori et al. | 358/213 |
| 4,675,534 | 6/1987 | Sekimura et al. | 250/578 |
| 4,808,833 | 2/1989 | Saito | 250/578 |

Primary Examiner—David C. Nelms
Attorney, Agent, or Firm—Fitzpatrick, Cella, Harper & Scinto

[57] ABSTRACT

A linear element array with n functional elements disposed one-dimensionally is constructed of a linear element array section having N blocks each having m functional elements, and a wiring section having m electrical wirings disposed side by side; wherein each of the functional elements is connected to a corresponding one of the electrical wirings by means of wire bonding.

10 Claims, 4 Drawing Sheets

☐ 6
— 13
---- 9

6a  6b

☐ 6
— 13
---- 9

⊣□ 6
— 13
---- 9

⊣□ 6
— 13
---- 9

LINEAR ELEMENT ARRAY WITH WIRE BONDING ARRANGEMENT

This application is a continuation of application Ser. No. 210,182 filed June 22, 1988, now abandoned, which is a continuation of Ser. No. 24,979, filed Mar. 12, 1987, now abandoned.

BACKGROUND OF THE INVENTION

1. Field of the Invention

The present invention relates to a linear element array having a plurality of functional elements disposed one-dimensionally, particularly such as a full-line contact type image sensor, thermal head and the like.

2. Related Background Art

A so-called linear functional image array has been adopted recently as an input/output device of a computer or a facsimile. The array with functional elements is disposed one-dimensionally and has substantially the same length as the width of an input/output medium such as an original sheet or a recording paper. For instance, an input device may be a contact type image sensor having, as functional elements, photosensors disposed linearly, and the output device may be a linear thermal head. The configuration of an input/output device whose length is substantially the same as the width of an input/output medium makes it, for example, in the case of a contact type image sensor, unnecessary to use a specific mechanical movable member which allows the optical system to be miniaturized. For this and other reasons, an input/output device of small size and high performance can be realized.

The length of a contact type image sensor or a thermal head is usually greater than A4 size (whose width is 216 mm). Therefore, a plurality of functional elements must be switched in operation by providing switching elements to respective functional elements. This is expensive and can be technically difficult. Thus, the functional elements are connected in a matrix fashion for driving them.

FIG. 1 is a circuit diagram showing an example of matrix interconnection between a plurality of functional elements. Functional elements e ($1 \leq i \leq N$, $1 \leq j \leq n$) of a linear element array 1 are divided into N blocks each having n bit functional elements. A contact type image sensor uses a photosensor element as the functional element e, while a thermal head uses a heat generating element. Terminals $V_1$ to $V_m$, $v_1$ to $v_n$ are connected to an unrepresented processor circuit to control (m×n) functional elements through their (m+n) terminals.

In the circuit arrangement of a conventional input/output device, a linear element array section 1 and a matrix circuit section 2 have been manufactured using separate linear element array and matrix wiring substrates. Thereafter, necessary circuits portion are mutually connected by means of wire bonding or the like. FIGS. 2 and 3 are diagrammatical plan and perspective views of a matrix wiring substrate. On an insulating substrate 7, first wiring layer 3, insulation layer 8 and second wiring layer 4 are formed, the first and second wiring layers 3 and 4 being connected at through-hole contacts 5. Such a matrix wiring substrate is of three-layer structure, which results in a complicated manufacturing process, low yield and hence high cost. Since there are large areas where a thin insulation layer (ordinarily thinner than 100 microns) is present between the superposing first and second wiring layers 3 and 4, capacitance between wirings becomes increased to hinder high speed operation. Further, there arises a technical problem that small current (100 to 500 mA) does not flow stably through the through-hole contact 5 due to a very thin insulation layer (likely to be formed on the first insulation layer 3, a residual portion of the insulation layer 8 and the like).

SUMMARY OF THE INVENTION

It is an object of the present invention to solve the above problems and provide a linear element array which can provide a simplified manufacturing process, improved yield, reliability and performance, and low cost.

According to the present invention, the linear element array with n functional elements disposed one-dimensionally is constructed of a linear element array section having N blocks each having m functional elements, and a wiring section having m electrical wirings disposed side by side; wherein each of the functional elements is connected to a corresponding one of the electrical wirings by means of wire bonding.

In the construction of the present invention, a linear element array section and, instead of a conventional matrix wiring substrate, a wiring section with a wiring pattern on a single conductive layer, are used. A matrix interconnection is made using the wire bonding method between each of the functional elements of the linear element array section and a corresponding one of the electrical wirings, some of the wires from the array section to the wiring section extending over one or more electrical wirings. Consequently, a simplified manufacturing process, improved yield, reliability and performance, and low cost can be readily realized.

DETAILED DESCRIPTION OF THE PREFERRED EMBODIMENTS

Preferred embodiments of the present invention will now be described with reference to the accompanying drawings.

Figure 1:
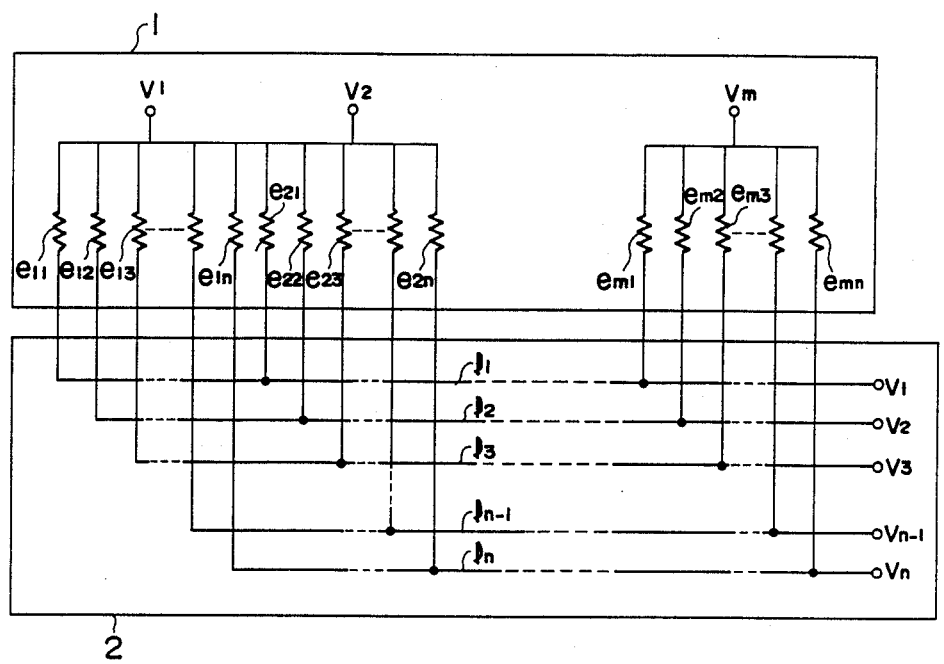
FIG. 1 is a circuit diagram illustrating a matrix drive.
Figure 2:
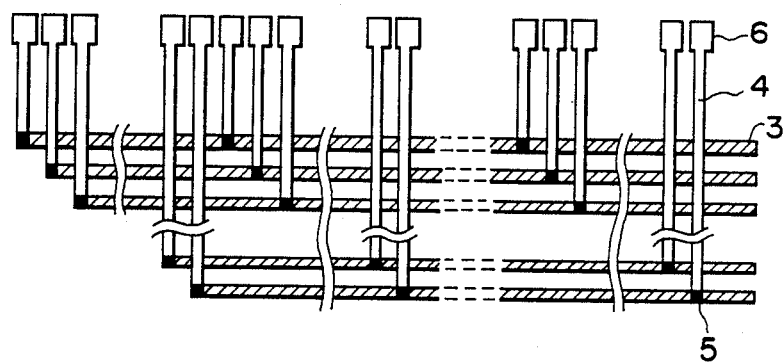
FIG. 2 is a diagrammatical plan view showing a conventional matrix wiring substrate.
Figure 3:
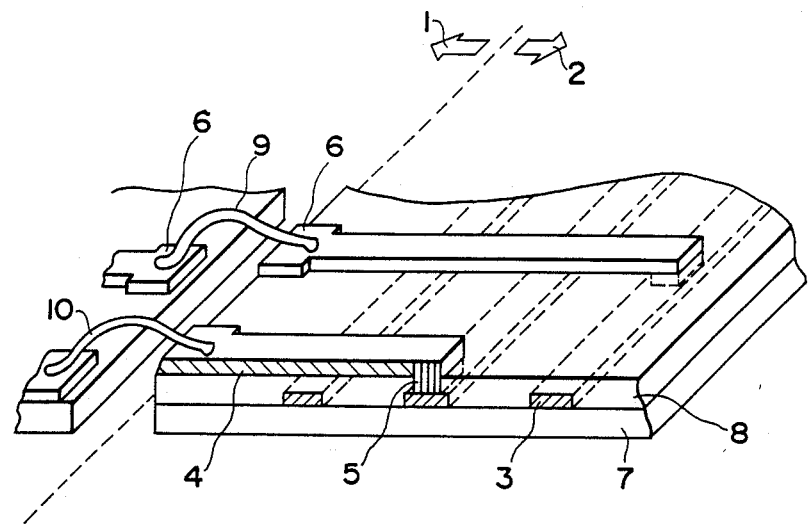
FIG. 3 is a perspective view diagrammatically illustrating the matrix interconnection of the matrix wiring substrate of FIG. 2.
Figure 4:
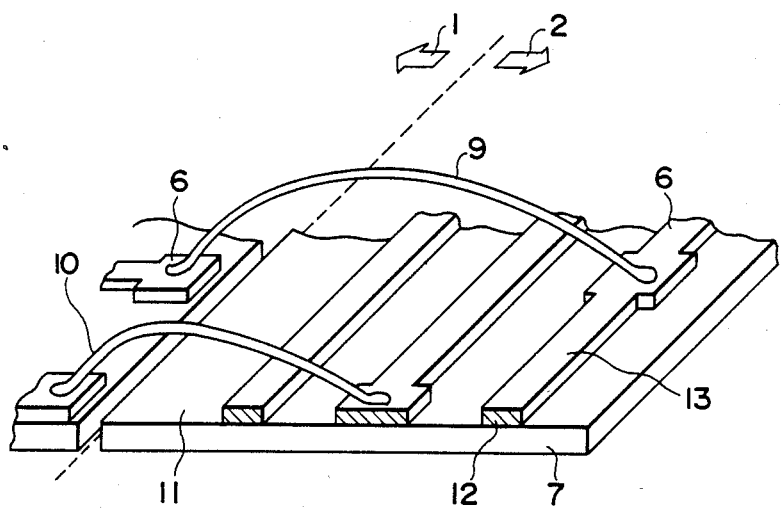
FIG. 4 is a perspective view diagrammatically illustrating a first embodiment of the present invention.
Figure 5:
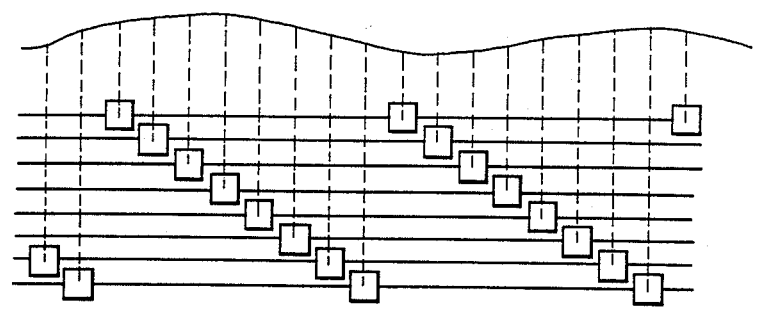
FIG. 5 is a diagrammatical plan view of the embodiment of FIG. 4.

FIG. 4 shows a first embodiment of a matrix wiring section which is the main part of this invention. Reference numeral 10 denotes a linear element array substrate, and 11 denotes a wiring substrate. The wiring substrate 11 has a wiring section which is constructed of a single conductive layer 12 having a desired pattern and formed on an insulation substrate 7. The wiring section is constructed of bonding pads 6 and wirings 13. A wire 9 is used for electrical connection between each functional element of the linear element array substrate 10 and a corresponding wiring 13 on the wiring substrate 11, by means of the wire bonding method. The wire 9 extends over some of the wirings 13 on the wiring substrate 11. FIG. 5 shows an example of the positional arrangement of wirings 13, bonding pads 6 and wires 9 as a plan view, wherein the number of bits of one block is 8 (n=8). In FIG. 5, connections of the wires 9 at one end are omitted, however, the wires 9 are practically connected to the respective functional elements of the linear element array substrate 10. As seen from FIG. 5, a matrix interconnection is achieved by the wirings 13 and the wires 9. In other words, a conventional specific matrix wiring substrate is not used in this invention, but the wires 9 are used not only as electrical connection to the wiring substrate 11, but also positively as a part of the matrix wiring section, to accordingly realize the simplified wiring substrate 11.

The matrix wiring section as constructed above makes it unnecessary to use a conventional matrix wiring substrate which requires a complicated manufacture process, thereby enabling low cost. Moreover, since the distance (ordinarily about 300 microns) between the wires 9 and the wirings 13 crossed over by the former is great, wiring capacitance can be substantially neglected to thereby enable high speed operation. The wire bonding method is a known, reliable method which ensures stable electric conduction.

Next, a second embodiment will be described with reference to FIG. 6. In this embodiment, improved yield and compactness of the array can be realized by the structure wherein the length of each wire is made shortest and uniform, even when the number of bits (e.g., n=32 or n=64) of one block becomes large. For simplifying the description, the number n of bits of one block is illustrated as 4.

Figure 6:
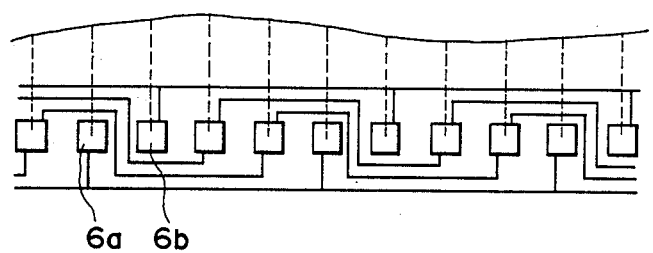
FIGS. 6, 7 and 8 diagrammatically show the arrangement of other embodiments of the present invention.

In the second embodiment of FIG. 6, bonding pads 6 are disposed linearly, and wirings 13 are disposed in an S-character shape. As a result, the length of the wire 9 can be made uniform and shortened, thereby simplifying manufacture processes and improving the yield. This embodiment utilizes the nature of the wires 13 wherein they can be patterned thinner and more freely as compared with the bonding pads 6. Further, according to this embodiment, as seen from FIG. 6, at least n-1, (2 in the Figure) wirings are passed between a bonding pad 6a connected to the last bit (4th bit in the Figure) of the block and a bonding pas 6b connected to the first bit. Therefore, it is easy to visually recognize each block.

Figure 7:
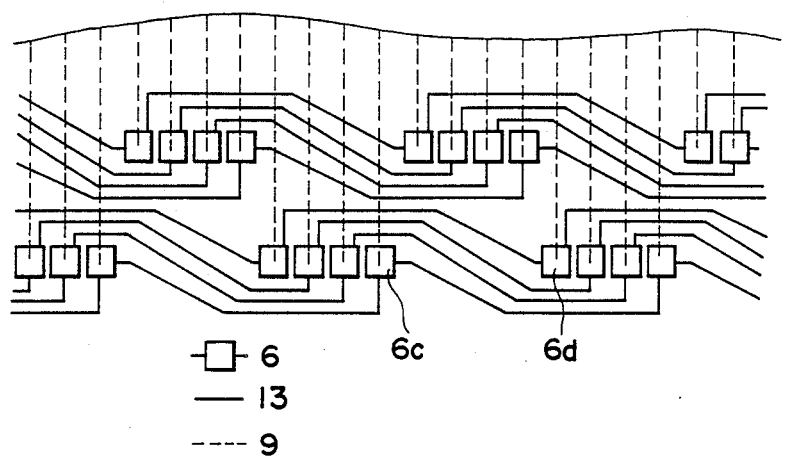
Figure 8:
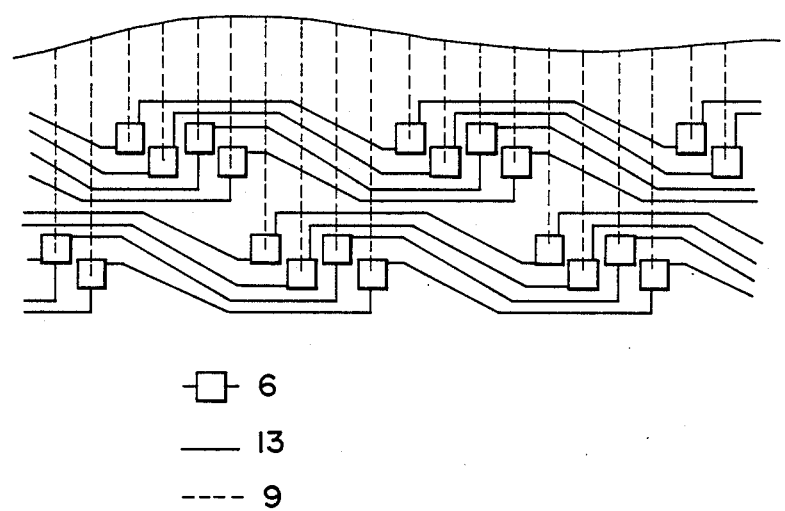

A third embodiment is shown in FIG. 7. In this embodiment, the number n of bits is 8. Wirings on the wiring substrate are divided into two groups; one group being connected to the upper bits of the block and the other group to the lower bits. Bonding pads 6 in each group are arranged linearly, while wirings 13 in each group are disposed in an S-character shape. Division of the wirings into plural groups enables a satisfactorily long interval between adjacent blocks (e.g., as between bonding pads 6c and 6d) within a same group, and hence a low wiring density between blocks. The number of groups is 2 in this embodiment, but the number is not limited thereto. For example, the number is 1 for the second embodiment, and the number is N for the first embodiment. The number of groups may be determined considering the easiness in patterning and wire bonding. Also, the number of bits of each block in each group is not necessarily the same but it may differ from one another. Further, bonding pads in a same group may not be disposed linearly, but they may be disposed in zigzag, as shown in FIG. 8. With zigzag arrangement, a distance between adjacent bonding pads is made large to thereby avoid contact between wires near the bonding pads.

As appreciated from the foregoing description, a matrix interconnection is realized by the use of the wiring substrate of simple construction and the wire bonding method without using a complicated matrix wiring substrate. Thus, a simplified manufacturing process, improved yield, reliability and performance, and low cost can be achieved.

What we claim is:

1. A linear element array comprising:
   a first linear substrate having a plurality of functional elements longitudinally disposed thereon, and a plurality of bonding pads coupled to respective ones of said functional elements;
   a second linear substrate having a plurality of non-superposed wiring extending in the longitudinal direction, and a plurality of bonding pads coupled to respective ones of said wiring; and
   a plurality of wires extending in a direction perpendicular to the longitudinal direction, each wire being bonded to a bonding pad on said first substrate and to a bonding pad on said second substrate.

2. An array according to claim 1 wherein the bonding pads of said second linear substrate are disposed in a staggered formation with respect to the longitudinal direction.

3. An array according to claim 2 wherein said plurality of non-superposed wiring extend only in the longitudinal direction.

4. An array according to claim 1 wherein the bonding pads of said second linear substrate are disposed one-dimensionally in the longitudinal direction.

5. An array according to claim 4, wherein each non-superposed wiring includes a portion extending in the longitudinal direction, and a portion extending in the direction perpendicular to said longitudinal direction.

6. An array according to claim 1, wherein the bonding pads of said second linear substrate are disposed in two longitudinally extending lines.

7. An array according to claim 6, wherein each non-superposed wiring extends in the longitudinal direction, a direction perpendicular to the longitudinal direction, and a direction oriented in between the longitudinal direction and the direction perpendicular thereto.

8. An array according to claim 1, wherein the bonding pads of said second linear substrate are disposed in staggered lines extending in the longitudinal direction.

9. An array according to claim 8, wherein each non-superposed wiring extends in the longitudinal direction, the direction perpendicular to said longitudinal direction, and a direction oriented in between the longitudinal direction and the direction perpendicular thereto.

10. A linear element array comprising:
    a first linear substrate having (1) a plurality of n functional elements longitudinally disposed thereon, the functional elements being divided into N blocks, each of which includes m functional elements, (2) a plurality of bonding pads, and (3) a plurality of m wiring disposed in a direction perpendicular to said longitudinal direction;
    a second linear substrate having (1) a plurality of non-superposed wiring electrically isolated from one another and disposed along said longitudinal direction in a non-matrix configuration, and (2) N bondng coupled to said non-superposed wiring; and
    a plurality of wires extending in a direction perpendicular to the longitudinal direction, each wire being bonded to a bonding pad on said first substrate and to a bonding pad on said second substrate.

* * * * *

UNITED STATES PATENT AND TRADEMARK OFFICE
CERTIFICATE OF CORRECTION

PATENT NO. : 4,935,637

DATED : June 19, 1990

INVENTOR(S) : Noriyuki KAIFU, ET AL.

It is certified that error appears in the above-identified patent and that said Letters Patent is hereby corrected as shown below:

COLUMN 1:

Line 56, "portion" should be deleted.

COLUMN 4:

Line 61, "bondng" should read --bonding pads--.

Signed and Sealed this

Seventh Day of July, 1992

Attest:

DOUGLAS B. COMER

*Attesting Officer*    Acting Commissioner of Patents and Trademarks